US006763582B2

(12) United States Patent
Kaiser et al.

(10) Patent No.: US 6,763,582 B2
(45) Date of Patent: Jul. 20, 2004

(54) THROTTLE VALVE UNIT WITH DRIVE UNIT RECEPTACLE AND DRIVE UNIT CONTACT

(75) Inventors: Klaus Kaiser, Markgroeningen (DE); Michael Brozio, Korntal-Muenchingen (DE); Markus Michels, Stuttgart (DE); Stefan Josten, Remscheid (DE)

(73) Assignee: Robert Bosch GmbH, Stuttgart (DE)

( * ) Notice: Subject to any disclaimer, the term of this patent is extended or adjusted under 35 U.S.C. 154(b) by 145 days.

(21) Appl. No.: 10/208,798

(22) Filed: Aug. 1, 2002

(65) Prior Publication Data

US 2003/0024119 A1 Feb. 6, 2003

(30) Foreign Application Priority Data

Aug. 3, 2001 (DE) ........................................ 101 38 060

(51) Int. Cl.[7] .......................... H05K 13/00; E02D 9/10

(52) U.S. Cl. .......................... 29/854; 29/825; 123/360; 123/361; 123/399

(58) Field of Search ........................... 29/854; 123/399, 123/360, 361, 337, 305

(56) References Cited

U.S. PATENT DOCUMENTS

| | | | | | |
|---|---|---|---|---|---|
| 5,490,487 | A | * | 2/1996 | Kato et al. | 123/399 |
| 5,718,202 | A | * | 2/1998 | Bentz et al. | 123/399 |
| 6,000,377 | A | * | 12/1999 | Sato et al. | 123/337 |
| 6,067,958 | A | * | 5/2000 | Kamimura et al. | 123/337 |
| 6,109,240 | A | * | 8/2000 | Sato et al. | 606/130 |
| 6,341,593 | B2 | * | 1/2002 | Kamimura et al. | 123/337 |
| 6,371,080 | B1 | * | 4/2002 | Saito et al. | 123/337 |
| 6,598,587 | B2 | * | 7/2003 | Kamimura et al. | 123/399 |
| 6,691,678 | B1 | * | 2/2004 | Hashimoto et al. | 123/399 |

* cited by examiner

*Primary Examiner*—Carl J. Arbes
(74) *Attorney, Agent, or Firm*—Ronald E. Greigg

(57) ABSTRACT

A throttle device in the intake section of an internal combustion engine; the throttle device including a housing part, which contains a flow cross section for an air flow. In the housing part, bearing points are provided for a throttle valve device, which can be actuated by means of an actuating drive. The actuating drive can be inserted into a receiving housing, which has first and second guide surfaces that permit the installation of the actuating drive. Fastening means are provided on the circumference surface of the receiving housing and can accommodate a closing and contacting element, which contacts electrical contacts of the actuating drive.

20 Claims, 5 Drawing Sheets

Fig. 5.2
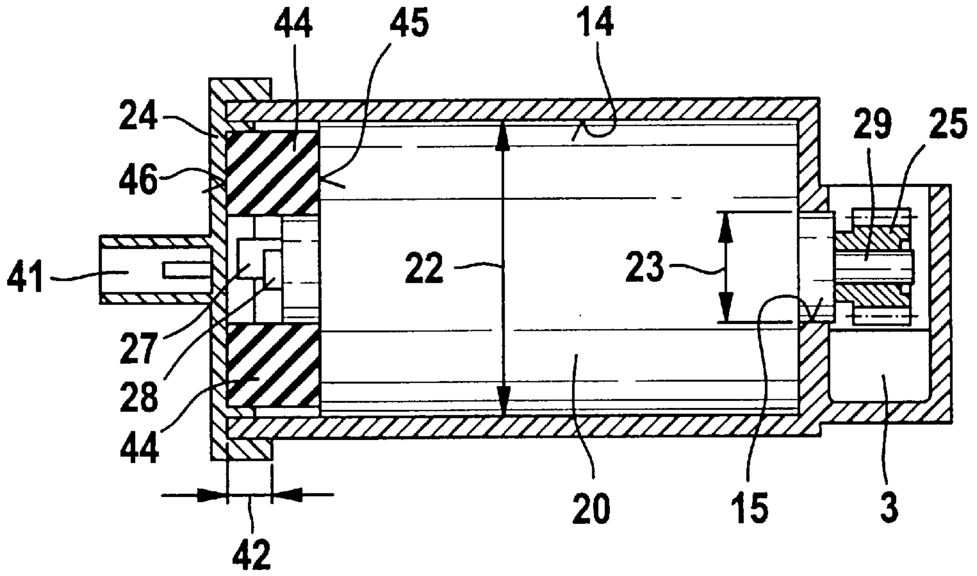

THROTTLE VALVE UNIT WITH DRIVE UNIT RECEPTACLE AND DRIVE UNIT CONTACT

BACKGROUND OF THE INVENTION

1. Field of the Invention

In internal combustion engines, throttle devices are used in the intake tube section and can regulate the air volume required by the internal combustion engine for the combustion of fuel in the combustion chamber of the engine. As a rule, the throttle devices include a drive unit, a throttle valve supported on a shaft, and a two-part throttle housing, which can be made of cast metal or embodied as an injection molded plastic part. In addition, throttle housings are often provided with a separate housing cover, which can be used to seal the housing in order to prevent the intake of outside air.

2. Description of the Prior Art

DE 195 25 510 A1 relates to a throttle valve adjusting unit which includes a throttle valve fastened to a throttle valve shaft supported so that it can rotate in a throttle valve fitting. An actuating motor, which is supported on the throttle valve fitting and is associated with the throttle valve shaft, can move the throttle valve. This actuating motor includes at least one slider and at least one potentiometer path for detecting an adjustment position of the throttle valve shaft with an electrical connection. The actuating motor and the potentiometer are connected to the electrical connection in a connection chamber. In addition, a sealing cover closes the connection chamber. The at least one potentiometer path is affixed to the cover and the cover has a coupling part formed onto it, which is associated with the electrical connection. In addition, the cover is provided with at least one motor plug contact, which electrically contacts a reciprocal motor plug contact connected to the actuating motor when the cover is mounted onto the throttle valve fitting.

DE 44 01 690 A1 relates to an intake tube design, in particular for use in internal combustion engines, which includes an at least two-part shell design including a first shell part and a second shell part are connected to each other by means of an elastic seal. The first shell part has a receiving region for the seal, into which a fixing part of the second shell part reaches. The receiving region is essentially embodied as an axially extending groove formed into the wall of the first shell part. By contrast, the fixing part is embodied as an essentially axially protruding rib formed onto the wall of the second shell part. Preferably an elastic seal made of closed-pore silicone foam is used as a sealing element. According to this embodiment, the shell parts are produced as thermoplastic injection molded parts.

The subject of DE 198 43 771 A1 is an electromotive actuator, in particular for use in a throttle device of an internal combustion engine. The electromotive actuator includes a housing and an electric motor disposed on a drive side inside the housing. The electric motor drives a moving element disposed in the housing, in particular a throttle valve; a separate electronics housing for containing control and/or evaluation electronics can be fastened to the housing. The drive side of the electromotive actuator is connected via electrical connection means to the electronics housing; in particular, the electrical connection means are a component of the electronics housing. The throttle valve housing includes a plug connector or a socket, which is complementary to the connection of the electrical connection means.

OBJECT AND SUMMARY OF THE INVENTION

With the embodiment proposed according to the invention, a guidance of the actuating drive, which actuates a throttle device, and fastening means can be embodied directly on the throttle device housing when it is manufactured. The throttle device housing is provided with a receiving housing, which can contain an actuating drive that is preferably embodied as an electric drive unit. The receiving housing for the actuating drive can be embodied with two guide surfaces, one of which is constituted by the inside of the circumference surface of the receiving housing. Another guide surface for the actuating drive, which can be inserted into the receiving housing, can be embodied in the vicinity of a limit wall at the end of the receiving housing.

When the actuating drive and the receiving housing are assembled, on the one hand, a closing and contacting element can affix the actuating drive in the receiving housing; on the other hand, an electrical contacting of the actuating drive can be simultaneously achieved during insertion of the actuating drive. The closing and contacting element is provided with an electrical contact on the outside for this purpose. During installation of the closing and contacting element, it rests against contacting pins, which are provided on the end of the actuating drive, and produces an electrical connection to the plug connection provided on the closing and contacting element. The closing and contacting element can be accommodated directly on the electric drive unit and can also be embodied as a separate component that is slid onto it.

Fastening means can be formed on the outside of the receiving housing for the actuating drive. The fastening means, several of which can be disposed distributed along the circumference surface of the receiving housing, include openings into which protrusions embodied as detent projections on the closing and contacting element engage in snap fashion. In lieu of a detent projection connection, screws or pins can also be used to attach the closing and contacting element to the receiving housing; in this instance, the fastening means are provided with internal threads, stop surfaces, or the like.

Sealing elements can be accommodated in the receiving housing, which allow the closing and contacting element to protect the actuating drive from external influences, such as dust or moisture. On the other hand, a damping element can be provided between the closing and contacting element and the end of the drive unit oriented toward the closing and contacting element, thus permitting a vibrationless support of the actuating drive inside the receiving housing.

The seal between the receiving housing and the closing and contacting element can be produced by an integrated labyrinth seal, an inserted seal in the form of an O-ring, or a glued connection between the two components. On the other hand, the receiving housing and the closing and contacting element can be connected to each other by means of ultrasonic welding or laser welding.

The embodiment according to the invention presents an inexpensive fastening possibility and contacting of an actuating drive on a throttle device, which in particular limits the number of required assembly steps.

BRIEF DESCRIPTION OF THE DRAWINGS

The invention will be better understood and further objects and advantages thereof will become more apparent from the ensuing detailed description of preferred embodiments taken in conjunction with the drawings, in which.

DESCRIPTION OF THE PREFERRED EMBODIMENTS

Figure 1:
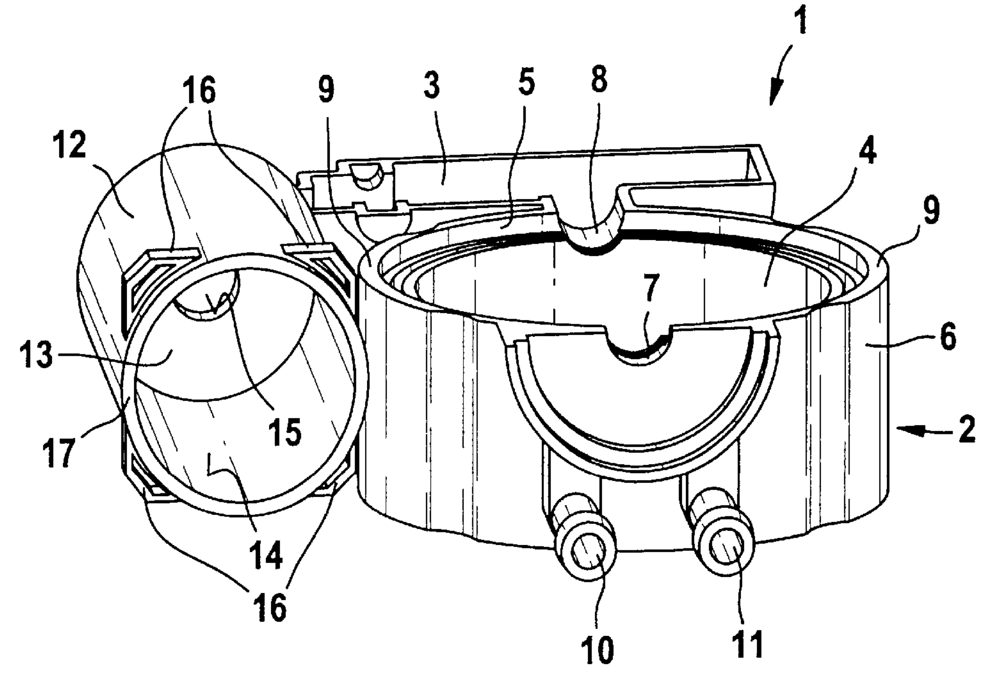
FIG. 1 shows a perspective top view of a housing half of the throttle device.

FIG. 1 shows a perspective top view of a housing half 2 of the throttle device which is produced by means of an original form process such as casting or by means of a multi-component injection molding technique. The housing half 2 includes a receiving shell 3 injection molded onto it, which encloses a throttle valve device, not shown here, that opens and closes an internal bore 4 of the housing half 2. The internal bore 4 of the housing half 2 is bounded by a wall 5 and extends over a tube section 6, i.e. the fitting region of the throttle device 1. In the plane of a contact region 9 of the housing half 2, a first bearing point 7 and a second bearing point 8 are formed onto the housing half 2 and rotatably support the bearing journals of a throttle valve device, not shown here, which can be inserted into the housing half 2. The contact region 9 of the housing half 2 constitutes the support surface for the installation of an upper housing half, not shown here, whose installation fixes the throttle valve device, also not shown here, with its bearing journals in the first bearing point 7 and the second bearing point 8.

In order to control the temperature of the tube section 6 of the housing half 2, an inlet 10 and an outlet 11 are provided, through which a temperature control medium can circulate.

According to the depiction in FIG. 1, a receiving housing 12, which is embodied here with a cylindrical design, is injection molded onto the side of the housing half 2. The wall of the receiving housing 12 defines a cylindrical cavity 13 in which a first guide surface 14 is constituted by the inner wall of the receiving housing 12. Another, or second guide surface 15 is provided in the bottom region of the cylindrically designed receiving housing 12. The second guide surface 15 is constituted by the wall thickness of the bottom surface of the cylindrical cavity 12 through which, for example, a drive element 25 of an actuating drive 20, which is embodied for example as a gear (see depiction according to FIG. 2) can be slid. Fastening means 16 are injection molded onto an end 17 of the receiving housing 12. The fastening means 16 are disposed distributed, preferably, evenly, over the circumference of the cylindrically designed receiving housing 12 and permit a closing and contacting element 24 (FIG. 2) to be locked in place.

Figure 2:
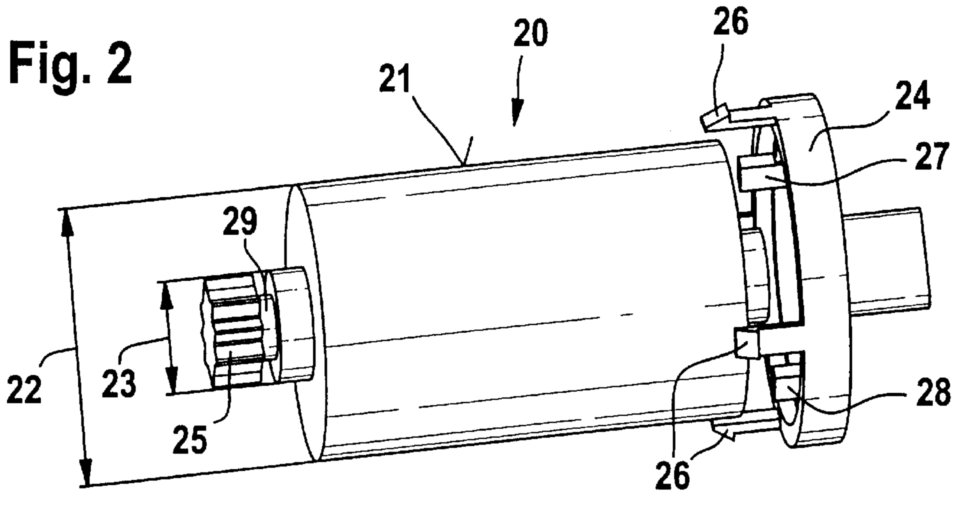
FIG. 2 shows a perspective view of an actuating drive with an electrical contacting element.

FIG. 2 shows a perspective view of an actuating drive 20 with electrical contacting.

The actuating drive 20 is embodied as a cylindrical body. The circumferential surface 21 of the actuating drive 20 is embodied with a first outer diameter 22, while a section, which is disposed between a drive element 25 embodied as a gear and the cylindrical body of the actuating drive 20, is embodied with a second outer diameter 23. The outer diameter 22 of the circumference surface 21 and the second outer diameter 23 between the drive element 25 and the cylindrical body of the actuating drive 20 correspond to the inner diameters of the first guide surface 14 and the second guide surface 15 in the bottom region of the receiving housing 12. The first and second guide surfaces 14 and 15 and the outer diameters 22 and 23 diametrically matched to them permit a precisely fitted insertion of the actuating drive 20 into the receiving housing 12 injection molded onto the housing half 2.

At the end of the actuating drive 20 oriented away from the drive element 25, a disk-shaped closure and contacting element 24 is provided. The circumference of the disk-shaped closing and contacting element 24 is provided with protrusions 26, which can engage in detent fashion, for example, with the fastening means 16 shown in FIG. 1 on the circumference of the receiving housing 12. On the inside of the closing and contacting element 24, contacting elements 27 and 28 are provided, which can connect the actuating drive 20 to an electrical connection 31 when the actuating drive 20 is inserted into the cavity 13 of the receiving housing 12 and the closing and contacting element 24 is subsequently fastened to the fastening means 16 of the receiving housing 12.

Figure 3:
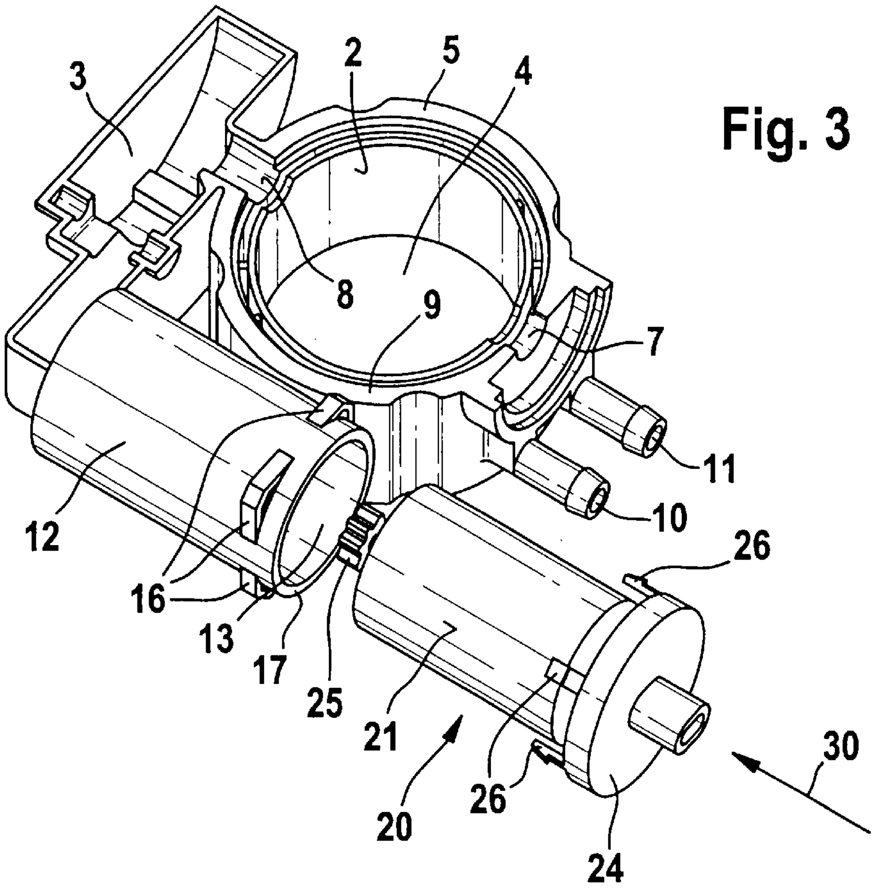
FIG. 3 shows the insertion of the electrical actuating drive into a housing half of the throttle device, FIGS. 4 and 4.1 show the actuating drive installed in a housing half of the throttle device.

In FIG. 3, the actuating drive 20 is inserted in the insertion direction 30 into the cavity 13 of the receiving housing 12. The circumference surface 21, embodied with the first diameter 22, is used as an insertion surface along the first guide surface 14, i.e. the inside of the circumference surface of the receiving housing 12. The closing and contacting element 24 can be integrated into the actuating drive 20, i.e. injection molded onto it, or can be slid onto it afterward, before the actuating drive 20 is inserted in the insertion direction 30 into the cavity 13 of the receiving housing 12. The protrusions 26 embodied on the circumference surface of the closing and contacting element 24 engage in detent fashion in the fastening means 16 on the receiving housing 12 (see depiction according to FIG. 4.1).

Figure 4:
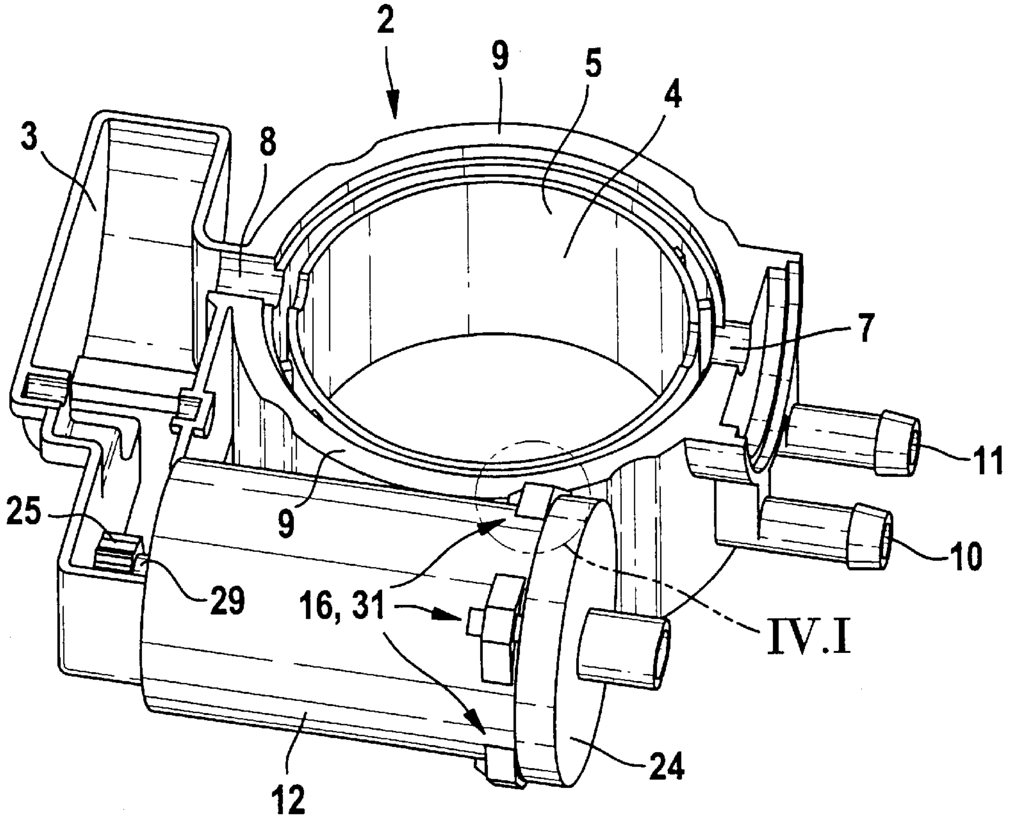
Figure 4:
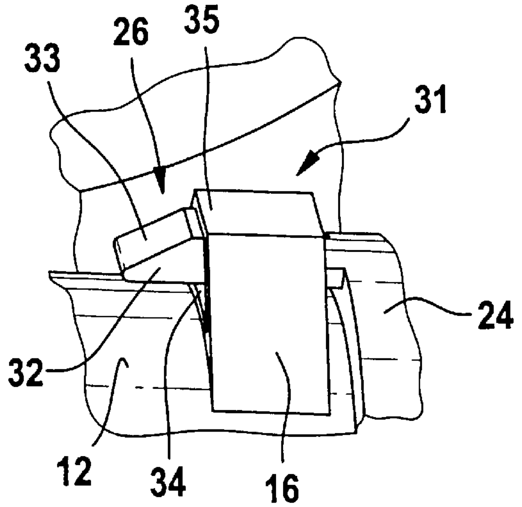

FIGS. 4 and 4.1 show the actuating drive installed in a housing half of the throttle device, with the actuating drive 20 completely enclosed by the receiving housing 12. The closing and contacting element 24 detent-connected to the fastening means 16 on the circumference surface of the receiving housing 12 hermetically seals the actuating drive 20 in the receiving housing 12 off from the outside.

FIG. 4.1 shows an enlargement of an assembly point 31 between the receiving housing and the closing and contacting element 24, with the fastening means 16 on the circumference of the receiving housing 12 is embodied as a detent connection. To that end, in their region disposed in the mounting direction 30, the protrusions 26 injection molded onto the closing and contacting element 24 are provided with an oblique surface 33. The oblique surface 33 of the protrusions 26 travels into openings 34 of the fastening means 16, which include a bridge-shaped section, and after being completely inserted into them, produces a snap connection, which can also be released again.

The fastening means 16 according to the depiction in FIG. 4.1 are produced by means of material bridges 16 made of injection molded plastic. If the fastening means 16 are penetrated by detent projections 32, it is not necessary to provide an internal thread in the vicinity of the openings 34 of the fastening means 16. By contrast, if the closing and contacting element 24 is fastened to the fastening means 16 on the circumference of the receiving housing 12 by means of a screw connection, then the insides of the openings 34 of the fastening means 16 can be provided with threaded sections.

Figure 5:
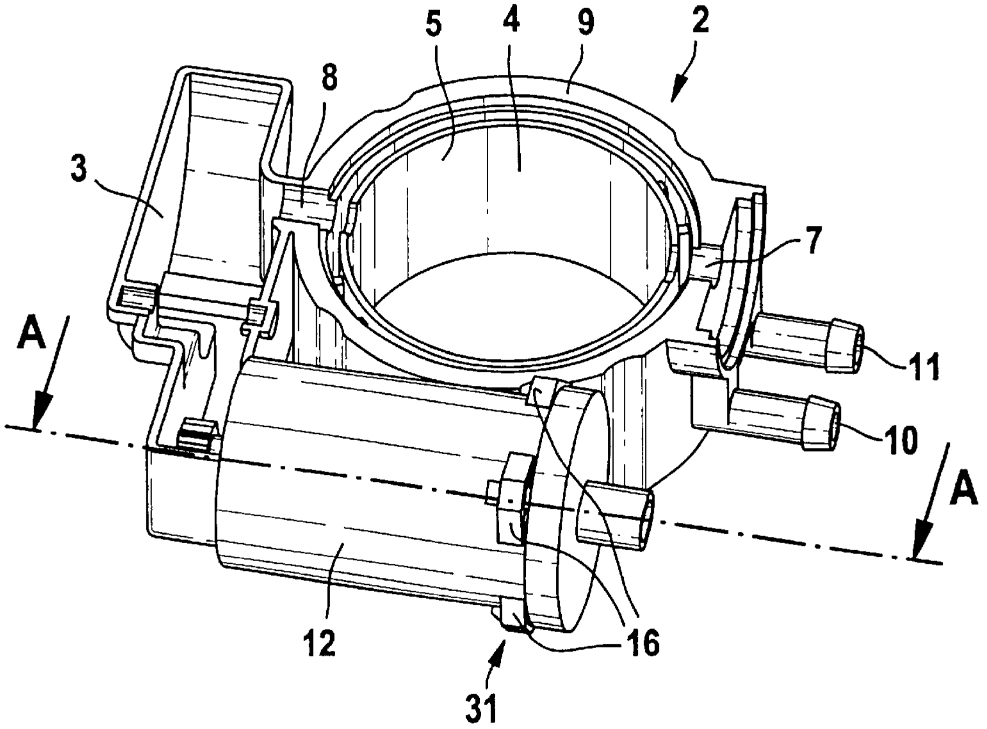
FIG. 5 shows the course of the longitudinal section through the actuating drive contained in the housing half, FIG. 5.1 shows an embodiment of a seal between the actuating drive and the receiving housing, and FIG. 5.2 shows an embodiment of a damping element, which is accommodated between the actuating drive and the closing and contacting element.
Figure 5:
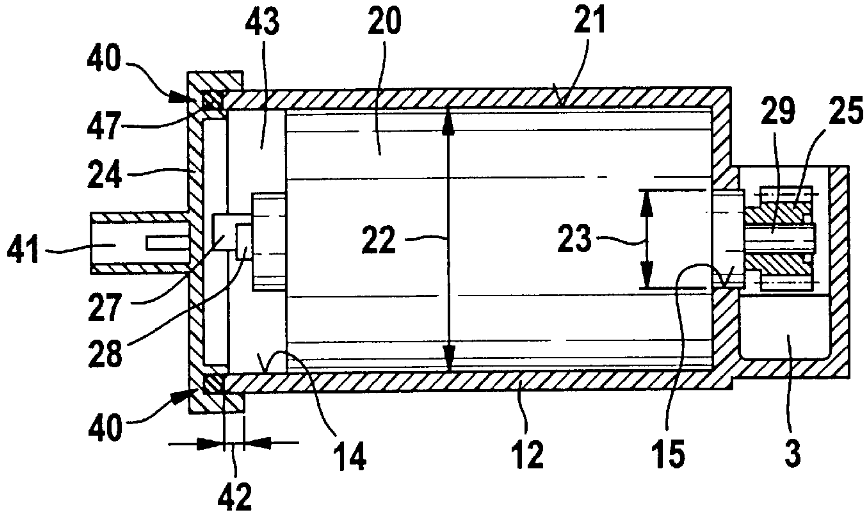

As shown in FIG. 5, the actuating drive 20 is contained inside the receiving housing 12; the contacting element is detent connected to the fastening means 16 at assembly points 31. The sectional course identified as A—A in FIG. 5 is shown in FIG. 5.1. The depiction according to FIG. 5.1 shows an embodiment of a seal between the actuating drive and the receiving housing.

The actuating drive 20 is contained inside the receiving housing 12 and its circumferential surface 21 rests with a first outer diameter 22 against the first guide surface 14 of the receiving housing 12. The section embodied with the second outer diameter 23 on the actuating drive 20 rests against the second guide surface 15 inside the receiving housing 12. The receiving shell 3 that is injection molded together with the receiving housing 12 encloses the drive element 25 configured as a gear, which is driven by means of the actuating drive 20. The driving element 25 embodied as a gear is supported on a drive shaft 29.

In the depiction according to FIG. 5.1, a sealing element, which is embodied as an O-ring 47 and is inserted between the closing and contacting element 24 and the end 17 of the receiving housing 12, protects the actuating drive 20 contained inside the receiving housing 12 from moisture and the penetration of dirt particles. In lieu of an insertable seal in the form of an O-ring 47, the closing and contacting element 24, which is embodied in the form of an injection molded disk, can encompass the end with an overlap 42 so that the seal can be integrated directly into the closing and contacting element 24. The collar embodied on the closing and contacting element 24 can be fastened to the circumferential surface of the receiving housing, for example by means of a materially adhesive process for example of a thermal joining process such as ultrasonic welding or laser welding. It is also possible to glue the collar on the closing and contacting element 24 to the circumference surface of the receiving housing 12. On the side of the closing and contacting element 24 opposite from the contacts 27 and 28, an electrical connection 41 is provided, by means of which a voltage can be applied to the actuating drive 20 inside the receiving housing 12.

The depiction according to FIG. 5.2 shows an embodiment of the integration of an actuating drive into the inside of a receiving housing; the actuating drive is supported in a vibrationless manner by means of a damping element 44 contained between a first support surface 45 on the actuating drive 20 and the inside of the closing and contacting element 24, which functions as a second support surface 46. The damping element 44 can be made of elastomer material, embodied in the form of a ring, and inserted into the annular space 43 (see depiction according to FIG. 5.1). The mounting of the closing and contacting element 24 onto the receiving housing 12, whether by means of a detent connection, a screw connection, ultrasonic welding, laser welding, or gluing, exerts an initial tension on the damping element 44 contained inside the receiving housing 12 so that the actuating drive 20, guided on the first guide surface 14 and on the second guide surface 15, is supported in a vibrationless manner. The longer the overlap 42 of the collar of the closing and contacting element 24 can be embodied in relation to the circumference surface of the receiving housing 12, clearly the better a seal is produced against the penetration of moisture and dirt particles.

The receiving housing 12 according to the invention, which is injection molded onto a housing half 2 of a throttle device 1, with first and second guide surfaces 14 and 15 embodied on it, permits a simple and inexpensively produced installation of an actuating drive 20 into it. When the actuating drive 20 is locked in place in the cavity 13 of the receiving housing 12, the actuating drive 20 is automatically and immediately contacted electrically so that the only remaining step is to electrically connect the electrical connection 41 of the closing and contacting element 24. The assembled unit, i.e. the housing half 2 with the actuating drive 20 contained in it, can be produced at a significantly lower cost, eliminating a large number of installation and processing steps, particularly if the housing half 2 with the receiving housing 12 injection molded onto it can be manufactured by means of an original forming process such as casting or plastic injection molding. In plastic injection molding, it is particularly advantageous to manufacture the housing half 2 of the throttle device 1 using two-component injection molding.

The foregoing relates to preferred exemplary embodiments of the invention, it being understood that other variants and embodiments thereof are possible within the spirit and scope of the invention, the latter being defined by the appended claims.

We claim:

1. A method for producing a housing part (2) of a throttle device (1) for an internal combustion engine, in which the housing part (2) includes a flow cross section for an air flow, contains bearing points (7, 8) for supporting a throttle valve device, and can be actuated by means of an actuating drive (20), the method comprising forming a receiving housing (12) for the actuating drive (20) with first and second guide surfaces (14, 15) for the actuating drive (20) integral with the housing part during production of the housing part, and forming fastening means (16) onto the housing part (2) to accommodate a closing and contacting element (24).

2. The method according to claim 1, comprising providing electrical contacts (27, 28) on an end of the actuating drive, and sliding the closing and contacting element (24) onto the actuating drive (20) at its end (45) that contains electrical contacts (27, 28).

3. The method according to claim 2, wherein the closing and contacting element (24) and the actuating drive (20) are inserted together into the receiving housing (12); and wherein upon installation (30), the closing and contacting element (24) achieves contact with the electrical contacts (27, 28) of the actuating drive (20).

4. The method according to claim 1, wherein the closing and contacting element (24) is integrated into the actuating drive (20).

5. The method according to claim 1, comprising connecting the receiving housing (12) and the closing and contacting element (24) to each other at assembly points (31) by means of a detent connection (16, 32).

6. The method according to claim 1, comprising connecting the receiving housing (12) and the closing and contacting element (24) to each other at assembly points (31) by means of a screw connection.

7. The method according to claim 5, further comprising providing a seal between the receiving housing (12) and the closing and contacting element (24) by means of an integrated, formed-on seal (42).

8. The method according to claim 6, further comprising providing a seal between the receiving housing (12) and the closing and contacting element (24) by means of an integrated, formed-on seal (42).

9. The method according to claim 5, further comprising producing the seal between the receiving housing (12) and the closing and contacting element (24) by means of an insertable sealing element (47).

10. The method according to claim 6, further comprising producing the seal between the receiving housing (12) and the closing and contacting element (24) by means of an insertable sealing element (47).

11. The method according to claim 1, comprising forming a materially adhesive connection between an end (17) or a circumferential surface (21) of the receiving housing (12) and the closing and contacting element (24).

12. The method according to claim 11, wherein the materially adhesive connection comprises an ultrasonic welded connection.

13. The method according to claim 11, wherein the materially adhesive connection is a laser welded joint.

14. The method according to claim 11, wherein the materially adhesive connection is a glued joint.

15. The method according to claim 1, wherein before the closing and contacting element (24) is mounted (30) onto the receiving housing (12), a damping element (44) is positioned in an annular space (43) or above the actuating drive (20).

16. The method according to claim 3, wherein before the closing and contacting element (24) is mounted (30) onto the receiving housing (12), a damping element (44) is positioned in an annular space (43) or above the actuating drive (20).

17. The method according to claim 5, wherein before the closing and contacting element (24) is mounted (30) onto the receiving housing (12), a damping element (44) is positioned in an annular space (43) or above the actuating drive (20).

18. The method according to claim 7, wherein before the closing and contacting element (24) is mounted (30) onto the receiving housing (12), a damping element (44) is positioned in an annular space (43) or above the actuating drive (20).

19. The method according to claim 9, wherein before the closing and contacting element (24) is mounted (30) onto the receiving housing (12), a damping element (44) is positioned in an annular space (43) or above the actuating drive (20).

20. A throttle device for use in an internal combustion engine, the throttle device being produced by the process of claim 1.

* * * * *